United States Patent
Suzuki

(10) Patent No.: US 7,704,879 B2
(45) Date of Patent: Apr. 27, 2010

(54) METHOD OF FORMING LOW-RESISTIVITY RECESSED FEATURES IN COPPER METALLIZATION

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 11/864,960

(22) Filed: Nov. 20, 2007

(65) Prior Publication Data
US 2009/0130843 A1 May 21, 2009

(51) Int. Cl.
*H01L 21/4763* (2006.01)
(52) U.S. Cl. .............................. 438/650; 257/E21.584
(58) Field of Classification Search ................ 438/648, 438/650.669, 672, 674, 686; 257/751, E21.584, 257/E21.585, E21.586
See application file for complete search history.

(56) References Cited

U.S. PATENT DOCUMENTS

| | | | |
|---|---|---|---|
| 4,851,895 A | 7/1989 | Green et al. | |
| 4,929,468 A | 5/1990 | Mullendore | |
| 4,938,999 A | 7/1990 | Jenkin | |
| 5,171,610 A | 12/1992 | Liu | |
| 5,372,849 A | 12/1994 | McCormick et al. | |
| 5,877,086 A | 3/1999 | Aruga | |
| 6,063,705 A | 5/2000 | Vaartstra | |
| 6,074,945 A | 6/2000 | Vaartstra et al. | |
| 6,077,780 A | 6/2000 | Dubin | |
| 6,232,230 B1 | 5/2001 | Iacoponi | |
| 6,242,349 B1 | 6/2001 | Nogami et al. | |
| 6,287,435 B1 | 9/2001 | Drewery et al. | |
| 6,303,809 B1 | 10/2001 | Chi et al. | |
| 6,319,832 B1 | 11/2001 | Uhlenbrock et al. | |
| 6,420,583 B1 | 7/2002 | Lienhard et al. | |
| 6,440,495 B1 | 8/2002 | Wade et al. | |

(Continued)

FOREIGN PATENT DOCUMENTS

CA 2206217 A1 11/1998

(Continued)

OTHER PUBLICATIONS

U.S. Patent and Trademark Office, Final Office Action received for related U.S. Appl. No. 11/693,298 dated Dec. 22, 2009, 21 pp.

(Continued)

*Primary Examiner*—David Vu
(74) *Attorney, Agent, or Firm*—Wood, Herron & Evans, LLP

(57) ABSTRACT

A method is provided for forming low-resistivity recessed features containing a ruthenium (Ru) film integrated with bulk copper (Cu) metal. The method includes providing a patterned substrate containing a recessed feature, depositing a barrier film in the recessed feature in a barrier film deposition chamber, transferring the patterned substrate from the barrier film deposition chamber to a Ru metal deposition chamber, heat-treating the barrier film in the presence of a $H_2$-containing gas in the Ru metal deposition chamber, and depositing a Ru metal film on the heat-treated barrier film. The method further includes, depositing a Cu seed layer on the Ru metal film and filling the recessed feature with bulk Cu metal. In other embodiments, the method further includes heat-treating the Ru metal film and the Cu seed layer prior to the bulk Cu metal filling.

20 Claims, 6 Drawing Sheets

U.S. PATENT DOCUMENTS

| | | | |
|---|---|---|---|
| 6,440,854 | B1 | 8/2002 | Rozbicki |
| 6,444,263 | B1 | 9/2002 | Paranjpe et al. |
| 6,508,919 | B1 | 1/2003 | Licata et al. |
| 6,605,735 | B2 | 8/2003 | Kawano et al. |
| 6,627,542 | B1 | 9/2003 | Gandikota et al. |
| 6,713,373 | B1 | 3/2004 | Omstead |
| 6,989,321 | B2 | 1/2006 | Yamasaki et al. |
| 7,107,998 | B2 | 9/2006 | Greer et al. |
| 7,264,846 | B2 | 9/2007 | Chang et al. |
| 7,270,848 | B2 | 9/2007 | Suzuki et al. |
| 7,279,421 | B2 | 10/2007 | Suzuki |
| 7,285,308 | B2 | 10/2007 | Hendrix et al. |
| 7,288,479 | B2 | 10/2007 | Suzuki |
| 7,459,396 | B2 | 12/2008 | Suzuki et al. |
| 2003/0129306 | A1 | 7/2003 | Wade et al. |
| 2004/0241321 | A1* | 12/2004 | Ganguli et al. .......... 427/255.28 |
| 2005/0110142 | A1 | 5/2005 | Lane et al. |
| 2006/0113675 | A1 | 6/2006 | Chang et al. |
| 2006/0121733 | A1 | 6/2006 | Kilpela et al. |
| 2006/0131751 | A1 | 6/2006 | Minamihaba et al. |
| 2006/0199372 | A1 | 9/2006 | Chung et al. |
| 2006/0220248 | A1 | 10/2006 | Suzuki |
| 2006/0240187 | A1 | 10/2006 | Weidman |
| 2006/0258152 | A1 | 11/2006 | Haider |
| 2006/0273431 | A1 | 12/2006 | He et al. |
| 2007/0059502 | A1 | 3/2007 | Wang et al. |
| 2007/0072415 | A1 | 3/2007 | Suzuki |
| 2007/0099422 | A1 | 5/2007 | Wijekoon et al. |
| 2007/0141735 | A1 | 6/2007 | Joo et al. |
| 2007/0284736 | A1 | 12/2007 | Yang et al. |
| 2008/0081464 | A1 | 4/2008 | Matsuda et al. |
| 2008/0284020 | A1* | 11/2008 | Ishizaka ...................... 257/751 |
| 2009/0085211 | A1* | 4/2009 | Robison et al. ............. 257/751 |

FOREIGN PATENT DOCUMENTS

| | | |
|---|---|---|
| EP | 0620291 | 10/1994 |
| JP | 2004146516 A | 5/2004 |
| WO | 0012777 A1 | 3/2000 |
| WO | 0026432 | 5/2000 |
| WO | 2005034223 | 4/2005 |

OTHER PUBLICATIONS

U.S. Patent and Trademark Office, Non-Final Office Action received in related U.S. Appl. No. 11/693,298 dated Apr. 13, 2009, 16 pp.

Chen et al., "Novel Post Electroplating In-Situ Rapid Annealing Process for Advanced Copper Interconnect Application." IEEE, 2000, pp. 194-196.

U.S. Patent and Trademark Office, Non-final Office Action received for related U.S. Appl. No. 11/693,298 dated Apr. 13, 2009, 16 pp.

U.S. Patent and Trademark Office, Non-final Office Action received for related U.S. Appl. No. 11/864,960 dated Jul. 24, 2009, 30 pp.

Czekaj, C. et al. Inorganic Chemistry (1988) No. 27, pp. 8-10.

Wang et al., Low-temperature chemical vapor deposition and scaling limit of ultrathin Ru films, Applied Physics Letters (Feb. 23, 2004) vol. 84, No. 8, pp. 1380-1382, American Institute of Physics, Melville, NY.

Boyd, Edwin P. et al., Chemical vapor deposition of metallic thin films using homonuclear and heteronuclear metal carbonyls, Chem. Mater. (1997) No. 9, pp. 1154-1158.

Green, M.L. et al., Chemical vapor deposition of ruthenium and ruthenium dioxide films, Journal of the Electrochemical Society, vol. 132, No. 11, pp. 2677-2685.

Cheng, Wei-Yuan et al., Initial growth of chemical-vapor-deposited Ru from bis(hexafluoroacetylacetonate) dicarbonyl ruthenium, Thin Solid Films 483 (2005) pp. 31-37.

Gatineau, Julien et al., Deposition of highly pure ruthenium thin films with a new metal-organic precursor, Surface and Coatings Technology 201 (2007), pp. 9146-9148.

Bykov, A. F. et al., Investigation of thermal properties of ruthenium(III) B-diketonate precursors for preparation of $RuO_2$ films by CVD, Journal of Thermal Analysis, vol. 46 (1996) pp. 1551-1565.

European Patent Office, International Search Report and Written Opinion of corresponding PCT Application No. PCT/US2009/031414, dated Apr. 29, 2009, 14 pp.

European Patent Office, International Search Report and Written Opinion of corresponding PCT Application No. PCT/IB2009/050910 dated Jul. 2, 2009, 15 pp.

Chen et al., Novel Post Electroplating In-situ Rapid Annealing Process for Advanced Copper interconnect Application, IEEE, 2000, pp. 194-196.

* cited by examiner

METHOD OF FORMING LOW-RESISTIVITY RECESSED FEATURES IN COPPER METALLIZATION

CROSS REFERENCE TO RELATED APPLICATIONS

The present invention is related to U.S. patent application Ser. No. 11/693,298, filed Mar. 29, 2007 and entitled METHOD OF FORMING LOW-RESISTIVITY COPPER FILM STRUCTURES. The present invention is also related to U.S. patent application Ser. No. 11/864,566, entitled VOID-FREE COPPER FILLING OF RECESSED FEATURES FOR SEMICONDUCTOR DEVICES and filed on Sep. 28, 2007. The entire contents of these applications are incorporated herein by reference in their entirety.

FIELD OF THE INVENTION

The invention relates to semiconductor devices, and more particularly to processing methods for forming low-resistivity recessed features containing a ruthenium (Ru) film integrated with bulk copper (Cu) metal.

BACKGROUND OF THE INVENTION

An integrated circuit (IC) contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect structure. Metal layers typically occupy etched pathways in the interlayer dielectric. A "via" normally refers to any recessed feature such as a hole, line or other similar feature formed within a dielectric layer that provides an electrical connection through the dielectric layer to a conductive layer underlying the dielectric layer. Similarly, recessed features containing metal layers connecting two or more vias are normally referred to as trenches.

A long-recognized objective in the constant advancement of IC technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. For example, the recessed features are becoming so small that voids in bulk metal filling of the recessed features are unacceptable. As the width of metal lines is scaled down to smaller submicron and even nanometer dimensions, electromigration failure, which may lead to open and extruded metal lines, is now a well-recognized problem. Moreover, as dimensions of metal lines further decrease, metal line resistivity increases substantially, and this increase in line resistivity may adversely affect circuit performance.

The introduction of Cu metal into multilayer metallization schemes for manufacturing integrated circuits is enabled by the damascene Cu plating process and is now extensively used by manufacturers of advanced microprocessors and application-specific circuits. However, Cu metal cannot be put in direct contact with dielectric materials since Cu metal has poor adhesion to the dielectric materials and Cu is known to easily diffuse into common integrated circuit materials such as silicon and dielectric materials where Cu is a mid-bandgap impurity. Furthermore, oxygen can diffuse from an oxygen-containing dielectric material into Cu, thereby decreasing the electrical conductivity of the Cu metal. Therefore, a diffusion barrier material is formed on dielectric materials and other materials in the integrated circuits to surround the Cu metal and prevent diffusion of the Cu into the integrated circuit materials.

A tantalum nitride/tantalum (TaN/Ta) bilayer is commonly used as a diffusion barrier/adhesion layer for Cu metallization since the TaN barrier layer adheres well to oxides and provides a good barrier to Cu diffusion and the Ta adhesion layer wets well to both TaN on which it is formed and to the Cu metal formed over it. However, Ta is normally deposited by sputtering or plasma processing methods, which are unable to provide conformal coverage over high aspect ratio recessed features. Ruthenium (Ru) has been suggested to replace the Ta adhesion layer since it may be conformally deposited and it adheres well to TaN and to Cu metal. However, Cu metallization structures containing Ru metal films have generally showed higher Cu resistivity than those containing the traditional TaN/Ta bilayers, thereby increasing the electrical resistance and adversely affecting the reliability of the semiconductor device.

Therefore, new processing methods are needed for forming low-resistivity recessed features containing a Ru metal film integrated with bulk Cu metal.

SUMMARY OF THE INVENTION

A method is provided for forming low-resistivity recessed features for Cu metallization of semiconductor devices. The recessed features can include vias and trenches traditionally found in integrated circuits. According to one embodiment, the method includes removing contaminants from a barrier film prior to Ru metal film deposition on the barrier film, in order to provide an improved Ru metal film/barrier film interface and an improved Ru metal film for bulk Cu metal filling of the recessed features.

According to one embodiment of the invention, the method includes providing a patterned substrate containing a recessed feature, depositing a barrier film in the recessed feature in a barrier film deposition chamber, transferring the patterned substrate from the barrier film deposition chamber to a Ru metal deposition chamber, heat-treating the barrier film in the presence of a $H_2$-containing gas in the Ru metal deposition chamber, and depositing a Ru metal film on the heat-treated barrier film. The method further includes, depositing a Cu seed layer on the Ru metal film and filling the recessed feature with bulk Cu metal. In other embodiments, the method further includes heat-treating the Ru metal film and the Cu seed layer prior to the bulk Cu metal filling.

DETAILED DESCRIPTION OF SEVERAL EMBODIMENTS OF THE INVENTION

Figure 1A:
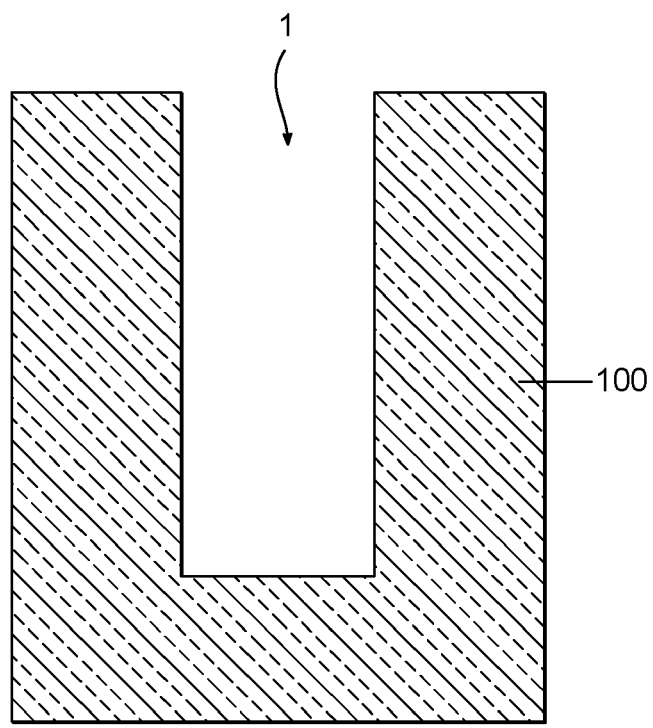
FIGS. 1A-1F schematically show cross-sectional views of a process for forming a low-resistivity recessed feature in Cu metallization according to an embodiment of the invention.

Method for forming low-resistivity recessed features for Cu metallization of semiconductor devices is disclosed in several embodiments. The current inventors have studied manufacturing of semiconductor devices containing a patterned substrate containing a recessed feature, a barrier film in the recessed feature, a conformal Ru metal film on the barrier film, and bulk Cu metal filling the recessed feature. In one example, prior to Ru metal deposition, the barrier film became oxidized due to high reactivity of the barrier film towards oxygen-containing background gases in a Ru metal deposition chamber. Subsequently, initial stages of Ru chemical vapor deposition (CVD) formed low Ru seed (nuclei) density on the oxidized barrier film compared to on an unoxidized barrier film. The low Ru seed density on the oxidized barrier film led to deposition of a Ru metal film with high film roughness increased electrical resistivity of the bulk Cu metal filled recessed feature due to high levels of electron scattering, poor adhesion between the oxidized barrier film and the Ru metal film, and reliability issues in the semiconductor device.

Embodiments of the invention remove contaminants from an oxidized barrier film prior to deposition of the Ru metal film, thereby providing an improved barrier film surface for deposition of the Ru metal film. Embodiments of the invention include heat-treating the oxidized barrier film by exposing it to a $H_2$-containing gas during or both during and following ramping up of the temperature of the patterned substrate to the Ru metal deposition temperature. The heat-treating chemically reduces the oxidized barrier film which improves formation of Ru seeds during initial stages of Ru metal deposition on the barrier film and subsequent bulk Cu metal filling of the recessed feature. Embodiments of the invention enable device manufacturers to integrate barrier films with highly conformal Ru metal films and void-free bulk Cu metal filling of high-aspect-ratio recessed features.

One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

FIGS. 1A-1F schematically show cross-sectional views of a process for forming a low-resistivity recessed feature in Cu metallization according to an embodiment of the invention. FIG. 1A shows a patterned substrate 100, for example a Si substrate or a dielectric film. The dielectric film may contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, or halogens, either as dense or porous materials. A recessed feature 1 is formed in the patterned substrate 100. The recessed feature 1 can, for example, be a via or a contact structure having an aspect ratio (depth/width) greater than or equal to about 2:1, for example 3:1, 4:1, 5:1, 6:1, 12:1, 15:1, or higher. The via/contact can have a width of about 200 nm or less, for example 150 nm, 100 nm, 65 nm, 45 nm, 32 nm, 22 nm, or less. However, embodiments of the invention are not limited to these aspect ratios or via/contact widths, as other aspect ratios and via/contact widths may be utilized. Processing methods for forming the recessed feature 1 in the patterned substrate 100 depicted in FIG. 1A are well known to one skilled in the art.

Figure 1B:
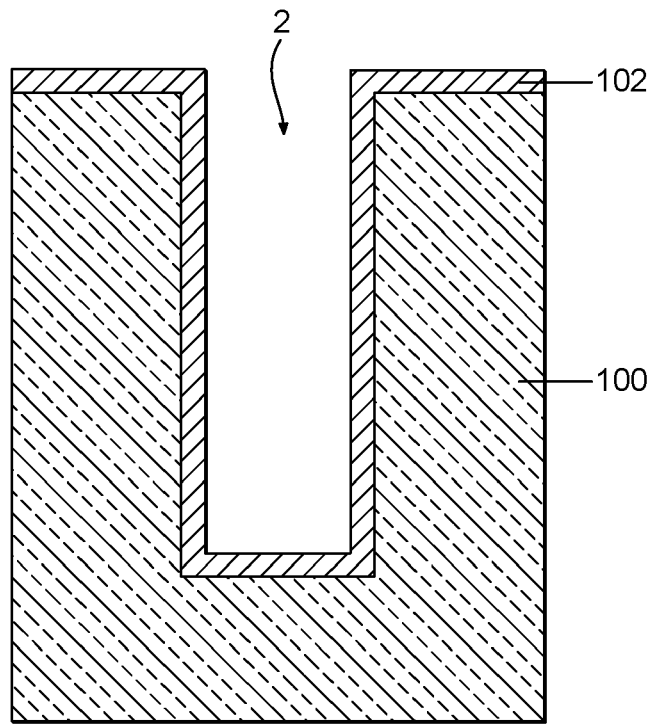

FIG. 1B shows a recessed feature 2 in which a barrier film 102 is formed on the patterned substrate 100, including in the recessed feature 1 of FIG. 1A. The barrier film 102 can, for example, be deposited in a barrier film deposition chamber and can include a tantalum(Ta)-containing film (e.g., TaN, TaC, or TaCN), a titanium(Ti)-containing film (e.g., TiN, TiC, or TiCN), or a tungsten(W)-containing film (e.g., WN, WC, or WCN), or a combination thereof. The combination may include two or more separate TaN, TiN, and WN films, for example TaN/TiN or TaN/WN. A thickness of the barrier film 102 can, for example, be between about 1 nm (nm=$10^{-9}$ m) and about 10 nm, or between about 2 nm and about 5 nm, for example about 4 nm. The barrier film 102 may be deposited by a variety of different deposition methods known by one of ordinary skill in the art, including, but not limited to, CVD, pulsed CVD, plasma-enhanced CVD (PECVD), atomic layer deposition (ALD), plasma-enhanced ALD (PEALD), or sputtering methods. In one example, the barrier film 102 may be conformally deposited over a high-aspect-ratio recessed feature 1.

A wide variety of Ta-, Ti-, and W-containing precursors may be utilized for depositing the barrier film 102. Representative examples of Ta-containing precursors include $Ta(NMe_2)_5$ (pentakis(dimethylamido)tantalum, PDMAT), $Ta(NEtMe)_5$ (pentakis(ethylmethylamido)tantalum, PEMAT), $(tBuN)Ta(NMe_2)_3$ (tert-butylimido tris(dimethylamido)tantalum, TBTDMT), $(tBuN)Ta(NEt_2)_3$ (tert-butylimido tris(diethylamido)tantalum, TBTDET), $(tBuN)Ta(NEtMe)_3$ (tert-butylimido tris(ethylmethylamido)tantalum, TBTEMT), $(EtMe_2CN)Ta(NMe_2)_3$ (tert-amylimido tris(dimethylamido)tantalum, TAIMATA), $(iPrN)Ta(NEt_2)_3$ (iso-propylimido tris(diethylamido)tantalum, IPTDET), $Ta_2(OEt)_{10}$ (tantalum penta-ethoxide, TAETO), $(Me_2NCH_2CH_2O)Ta(OEt)_4$ (dimethylaminoethoxy tantalum tetra-ethoxide, TATDMAE), and $TaCl_5$ (tantalum pentachloride). Representative examples of Ti-containing precursors include $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TD MAT), $Ti(TH D)_3$ (tris(2,2,6,6-tetramethyl-3,5-heptanedionato)titanium), and $TiCl_4$ (titanium tetrachloride). Representative examples of W-containing precursors include $W(CO)_6$ (tungsten hexacarbonyl), $WF_6$ (tungsten hexafluoride), and $(tBuN)_2W(NMe_2)_2$ (bis (tert-butylimido)bis(dimethylamido)tungsten, BTBMW). In the above precursors, as well as precursors described below, the following abbreviations are used: Me: methyl; Et: ethyl; iPr: isopropyl; tBu: tert-butyl; Cp: cyclopentadienyl; and THD: 2,2,6,6-tetramethyl-3,5-heptanedionate. In some examples, a nitrogen-containing gas such as ammonia ($NH_3$) or hydrazine ($N_2H_4$) may be utilized as a source of nitrogen when depositing the barrier film 102.

Figure 1C:
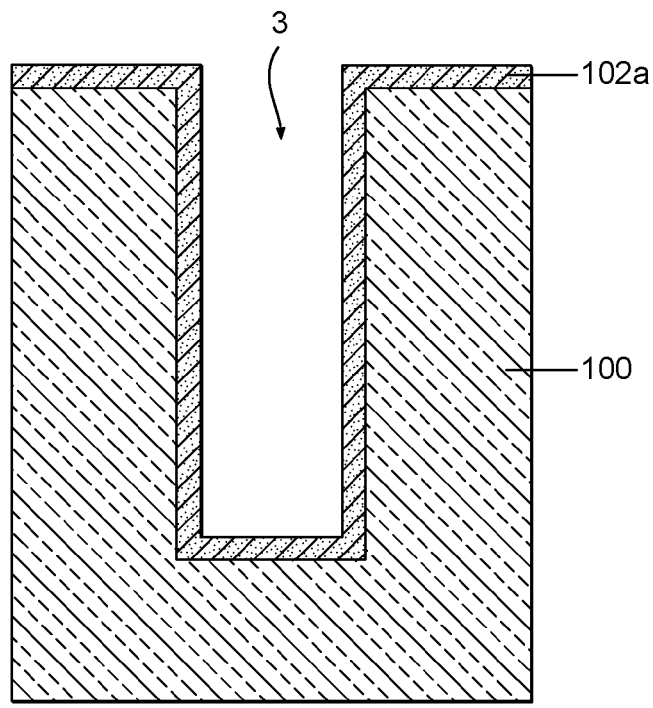

Following deposition of the barrier film 102, the patterned substrate 100 is transferred from the barrier film deposition chamber to a Ru metal deposition chamber. Once in the Ru metal deposition chamber, the patterned substrate 100 is positioned on a substrate holder and the temperature of the patterned substrate 100 is ramped up to the Ru metal deposition temperature. The current inventors have realized that the barrier film 102 may be highly reactive towards oxygen-containing background gases encountered during the transfer to the Ru metal deposition chamber and/or in the Ru metal deposition chamber. Exposure of the barrier film 102 to these oxygen-containing gases can result in oxidation through at least a portion of a thickness of the barrier film 102 and formation of a recessed feature 3 containing an oxidized barrier film 102a, as shown in FIG. 1C. In particular, oxidation of the barrier film 102 may occur during a temperature ramp up of the patterned substrate 100 to a Ru metal deposition temperature in the Ru metal deposition chamber, prior to Ru metal deposition. Ru metal deposition chambers commonly use a gaseous Ru precursor along with a carrier gas that aids in the gaseous transfer of the Ru precursor vapor from a precursor vaporization system to the Ru metal deposition chamber where a Ru metal film is deposited on the heated patterned substrate 100. These Ru metal deposition chambers often contain oxygen-containing background gases that may originate from oxygen-containing process gases (e.g., $Ru_3(CO)_{12}$ and CO carrier gas) or other oxygen-containing gases such as $H_2O$ and $CO_2$ that are commonly found in Ru metal deposition chambers and in other vacuum chambers. In addition to oxygen-containing background gases, the barrier film 102 may be exposed to carbon-containing gases, resulting in carbon contamination on the barrier film 102.

Figure 1D:
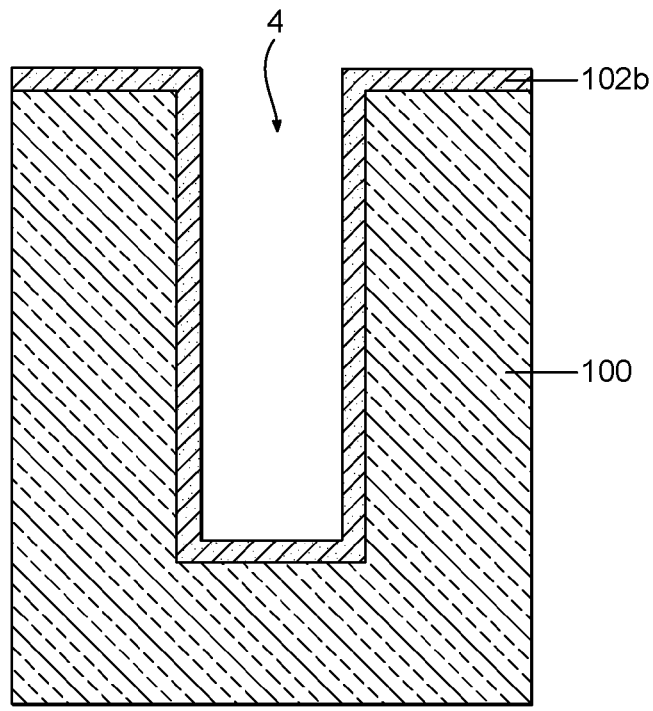

According to an embodiment of the invention, the patterned substrate 100 may be exposed to a $H_2$-containing gas during, following, or both during and following the temperature ramp up, prior to deposition of the Ru metal film in the Ru metal deposition chamber. FIG. 1D schematically shows a recessed feature 4 having a heat-treated barrier film 102b formed by heat-treating the oxidized barrier film 102a in recessed feature 3.

Figure 2A:
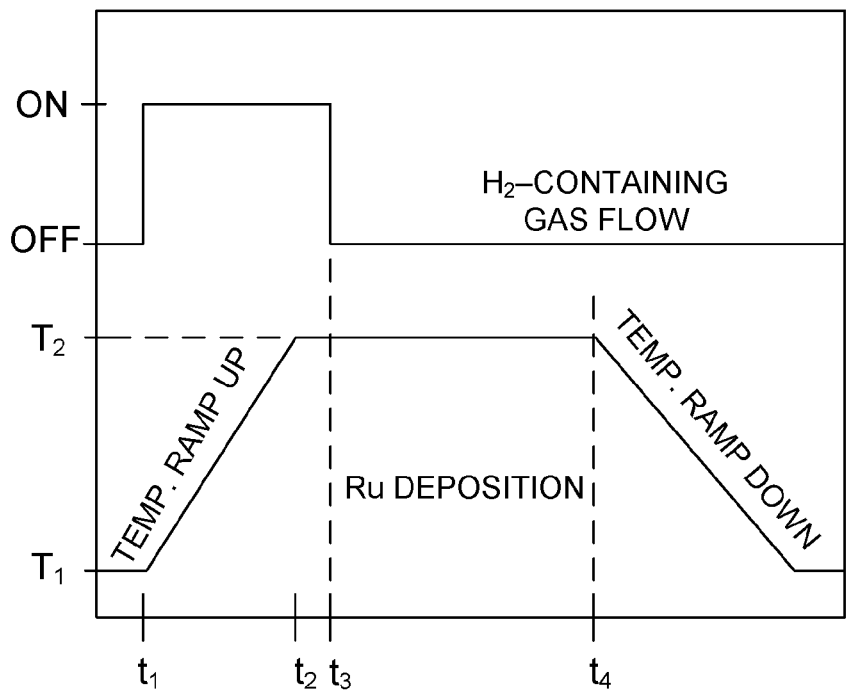
FIGS. 2A and 2B schematically show substrate temperature and $H_2$-containing gas flow during heat-treating of a barrier film and subsequent Ru metal deposition according to embodiments of the invention.

FIG. 2A schematically shows substrate temperature and $H_2$-containing gas flow during heat-treating of an oxidized barrier film and subsequent Ru metal deposition according to one embodiment of the invention. In the embodiment depicted in FIG. 2A, the patterned substrate 100 containing the oxidized barrier film 102a depicted in FIG. 1C is exposed to a $H_2$-containing gas during a temperature ramp up from temperature $T_1$ (e.g., substrate holder idle temperature) at time $t_1$ to temperature $T_2$ (e.g., about 200° C. for Ru metal deposition from $Ru_3(CO)_{12}$) at time $t_2$. In FIG. 2A, the patterned substrate 100 is further exposed to the $H_2$-containing gas while the patterned substrate 100 is maintained at the temperature $T_2$ prior to start of the Ru metal deposition at time $t_3$.

Other embodiments may utilize other temperature profiles and other $H_2$-containing gas flows. In another embodiment depicted in FIG. 2B, the $H_2$-containing gas exposure is stopped at time $t_2'$ and at a temperature $T_2'$ lower than $T_2$. Another embodiment (not shown) includes ramping the substrate temperature to temperature $T_2'$ greater than $T_2$ during an $H_2$-containing gas exposure, stopping the $H_2$-containing gas exposure at the temperature $T_2'$, and lowering the temperature from $T_2'$ to $T_2$ prior to the Ru metal deposition. Still other embodiments include exposing the patterned substrate 100 to a $H_2$-containing gas prior to and during the Ru metal deposition.

According to embodiments of the invention, the $H_2$-containing gas can include pure $H_2$, or a combination of $H_2$ and an inert gas. The inert gas may be selected from $N_2$ and noble gases (i.e., He, Ne, Ar, Kr, and Xe). Furthermore, the $H_2$-containing gas may be plasma excited or non-plasma excited. Combinations of $H_2$ and an inert gas can, for example, include 90% $H_2$ or less, for example 80%, 60%, 20%, 10%, 5%, or less, and balance inert gas. Exemplary heat-treating conditions further include a gas pressure between about 1 Torr and about 1000 Torr, and exposure times between about 1 min and about 30 minutes, but embodiments of the invention are not limited by these heat-treating conditions as other heat-treating conditions may be utilized. In some embodiments of the invention, the gas pressure can be between about 0.1 Torr and about 100 Torr, or between about 0.5 Torr and about 10 Torr.

Figure 1E:
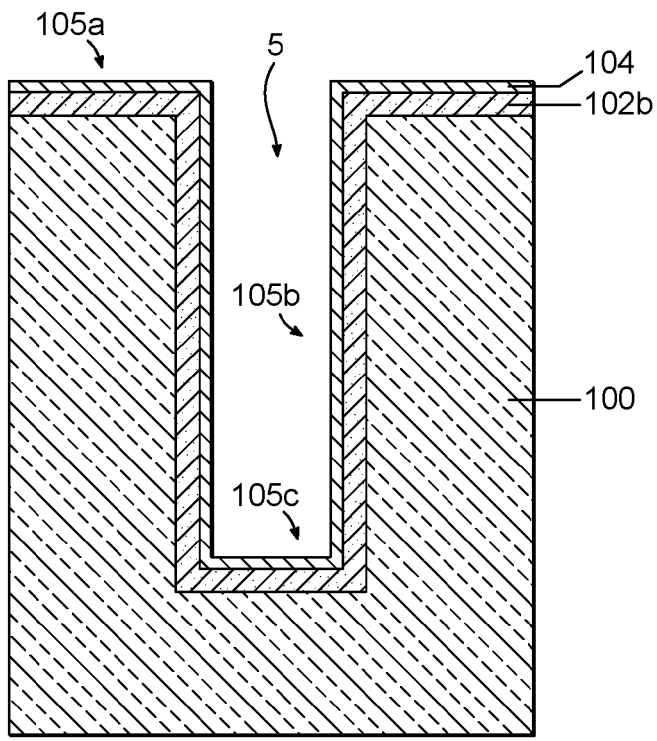
Figure 2B:
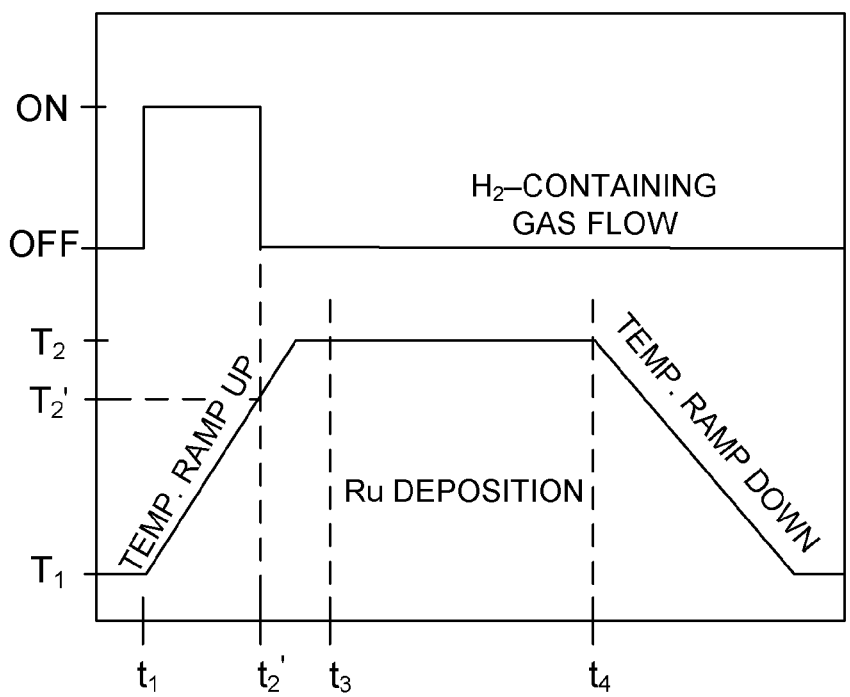

Still referring to FIGS. 2A and 2B, at time $t_3$, a Ru metal film 104 depicted in FIG. 1E is deposited on the heat-treated barrier film 102b to form recessed feature 5, including deposition on the field area 105a around the recessed feature 5, and on the sidewall 105b and the bottom surface 105c in the recessed feature 5. The Ru metal deposition ends at $t_4$ and the temperature is ramped down. A thickness of the Ru metal film 104 can, for example, be between about 0.5 nm and about 5 nm, or between about 1 nm and about 3 nm, for example about 2 nm. An exemplary Ru CVD process using a $Ru_3CO_{12}$ precursor and a CO carrier gas is described in U.S. patent application Ser. No. 10/996,145, entitled METHOD AND DEPOSITION SYSTEM FOR INCREASING DEPOSITION RATES OF METAL LAYERS FROM METAL-CARBONYL PRECURSORS, the entire content of which is incorporated herein by reference. In another example, the Ru metal film 104 may be deposited by a CVD process utilizing a ruthenium metalorganic precursor. Exemplary ruthenium metalorganic precursors include (2,4-dimethylpentadienyl) (ethylcyclopentadienyl) ruthenium (Ru(DMPD)(EtCp)), bis (2,4-dimethylpentadienyl)ruthenium (Ru(DMPD)$_2$), 4-dimethylpentadienyl)(methylcyclopentadienyl)ruthenium (Ru (DMPD)(MeCp)), and bis(ethylcyclopentadienyl)ruthenium (Ru(EtCp)$_2$), as well as combinations of these and other precursors. Other examples for depositing the Ru metal film 104 include sputtering methods using a solid Ru metal target. According to one embodiment of the invention, the heat-treated barrier film 102b may be at least partially removed from the bottom surface 105c of the recessed feature 5 prior to depositing the Ru metal film 104.

Figure 1F:
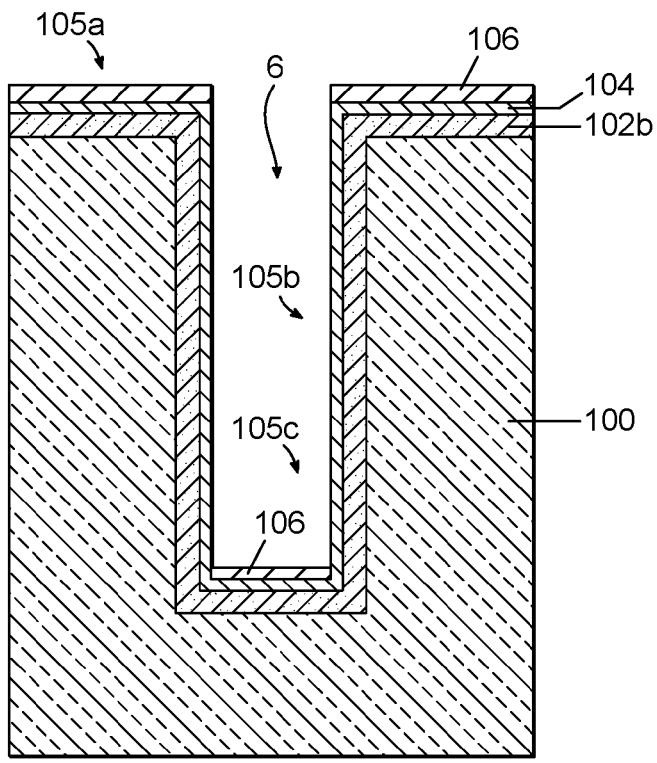

FIG. 1F shows a recessed feature 6 in which a Cu seed layer 106 is deposited on the Ru metal film 104 of recessed feature 5. The Cu seed layer 106 is discontinuous and may be deposited by a directional sputtering process (e.g., by ionized physical vapor deposition (IPVD)) from a solid Cu target. An exemplary IPVD system is described in U.S. Pat. No. 6,287, 435, but other types of sputtering systems may be used. The directional character of the Cu sputtering process preferably deposits Cu metal on the field area 105a and on the bottom surface 105c, with little or no Cu metal deposited on the sidewall 105b. Although not shown in FIG. 1F, some Cu metal may also be deposited on the sidewall 105b with exposed areas of the Ru metal film 104 between the Cu metal. In one example, the Cu seed layer 106 may have very low step coverage (ratio of Cu thickness on the sidewall 105b and on the field area 105a), for example less than 10%. A thickness of Cu seed layer 106 on the field area 105a and on the bottom surface 105c can, for example, be between about 0.5 nm and about 50 nm, or between about 1 nm and about 20 nm, for example about 5 to 10 nm. According to another embodiment of the invention, the Cu seed layer 106 may be conformally deposited over the Ru metal film 104 using a resputtering of the Cu seed layer or a Cu CVD process. According to one embodiment of the invention, the heat-treated barrier film 102b and the Ru metal film 104 may be at least partially removed from a bottom surface 105c of the recessed feature 5 prior to depositing the Cu seed layer 106.

When used with the Ru metal film 104, the Cu seed layer 106 may be thinner than a conventional Cu seed layer used for Cu plating (e.g., a Cu seed layer on a Ta layer), where the Cu thickness is commonly greater than about 50 nm. Importantly, only a small amount of Cu needs to be deposited inside the recessed feature 6 for good Cu plating results. In FIG. 1F, the Cu seed layer 106 is relatively thick on the field area 105a, thereby providing a low-resistivity path for conducting current from the substrate edge (e.g., substrate edge of a 300 mm Si wafer) to the entire surface of the substrate. As those skilled in the art will readily recognize, the amount of Cu metal deposited in the recessed feature 6 will depend on the widths and depths of the recessed feature 6. Furthermore, since scaling of future semiconductor devices will continue to ever smaller minimum feature sizes, widths of recessed features will continue to decrease and depths will continue to increase. Therefore, the amount of the Cu metal inside the recessed features will continue to decrease. However, embodiments of the invention require little Cu metal to be deposited inside the recessed feature 6, thereby providing a method for successfully performing Cu metallization for the future scaling of semiconductor devices. A role of a discontinuous Cu seed layer that is relatively thick on the field area 105a (compared to in the recessed feature 6) includes reducing the terminal ('resistive substrate') effect that is commonly encountered in electrochemical plating processing where a non-uniform thickness of the plated Cu layer over the whole substrate (wafer) is observed. The terminal effect is the tendency for the current density to be non-uniform as a result of the ohmic potential drop associated with conducting current from the substrate edge to the entire substrate surface through a thin resistive layer.

Further processing of the recessed feature 6 depicted in FIG. 1F includes bulk Cu metal filling of the recessed feature 6. Bulk Cu metal deposition processes are well known by one of ordinary skill in the art of circuit fabrication and can, for example, include an electrochemical plating process or an electroless plating process. For example, a planarized bulk Cu metal fill (not shown) may be formed by a Cu plating process and a Cu planarization process (e.g., chemical mechanical polishing (CMP)) that removes extra plated Cu metal from the patterned substrate 100.

Prior to Cu plating, the patterned substrate 100 depicted in FIG. 1F is transferred in air to a Cu plating bath in a Cu plating system. During the transfer, the patterned substrate 100 is exposed to oxidation sources in the air, including water ($H_2O$) and oxygen ($O_2$). The air exposure may last a few hours and cause at least partial oxidation through a thickness of the Cu seed layer 106 and the portion of the Ru metal film 104 on the sidewall 105b that is not covered by the Cu seed layer 106. While any oxidized Cu is dissolved in the Cu plating bath during a subsequent Cu plating process and does therefore not cause a problem, the presence of an oxidized Ru metal film in the recessed feature 6 can have detrimental effect on bulk Cu metal filling of the recessed feature 6, resulting in voids on or near the oxidized Ru metal film in the bulk Cu metal fill. As is well known to those skilled in the art, the presence of the voids in the incomplete bulk Cu metal fill increases the electrical resistance and adversely affects the reliability of the semiconductor device.

Thus, according to yet another embodiment of the invention, the Ru metal film 104 and the Cu seed layer 106 in FIG. 1F may be further heat-treated at a temperature between about 100° C. and about 400° C. to remove contaminants such as oxygen from the Ru metal film 104. The Ru metal film 104 and the Cu seed layer 106 may be heat-treated under high-vacuum conditions (e.g., gas pressure of about 1 mTorr, or lower) or in the presence of an inert gas but not $H_2$ to activate the Ru metal film for Cu plating. The inert gas can, for example, be selected from a noble gas and $N_2$. An exemplary heat treatment of the Ru metal film 104 and Cu seed layer in FIG. 1F can include a gas pressure of 3 Torr and process time of 30 minutes, but other heat-treating conditions may be utilized. For example, the inert gas pressure can be between about 0.1 Torr and about 760 Torr, or the gas pressure can be between about 0.5 Torr and about 10 Torr. Exemplary heat-treating of the Ru metal film 104 and the Cu seed layer 106 in FIG. 1F is described in U.S. patent application Ser. No. 11/864,566, entitled VOID-FREE COPPER FILLING OF RECESSED FEATURES FOR SEMICONDUCTOR DEVICES, the entire content of which is incorporated herein by reference.

According to one embodiment of the invention, the Ru metal film 104 in FIG. 1E, may be heat-treated at a temperature between about 100° C. and about 400° C. prior to deposition of the Cu seed layer 106. During the heat-treating, the Ru metal film 104 may be exposed to $H_2$, or a combination of an inert gas and $H_2$, with or without a plasma. The inert gas can, for example, be selected from a noble gas and $N_2$. A combination of an inert gas and $H_2$ can, for example, include a $H_2$/Ar mixture. Combinations of $H_2$ and an inert gas can, for example, include 90% $H_2$ or less, for example 80%, 60%, 20%, 10%, 5%, or less, and balance inert gas. It is believed that the heat-treating is effective to remove contaminants such as carbon and oxygen from the Ru metal film 104, thereby increasing the adhesion of the Cu seed layer 106 and the bulk Cu metal fill to the Ru metal film 104. An exemplary heat treatment of the Ru metal film 104 includes a gas pressure of 3 Torr and process time of 30 minutes, but other heat-treating conditions may be utilized. For example, the gas pressure can be between about 0.1 Torr and about 760 Torr, or the gas pressure can be between about 0.5 Torr and about 10 Torr.

According to still another embodiment of the invention, the patterned substrate 100 in FIG. 1G may be heat-treated at a temperature between about 100° C. and about 400° C. following the Cu plating and planarization process to reduce the electrical resistivity of the planarized bulk Cu metal fill 106a. During the heat-treating, the bulk Cu metal fill 106a may be exposed to an inert gas, $H_2$, or a combination of an inert gas and $H_2$. The inert gas can, for example, be selected from a noble gas and $N_2$. A combination of an inert gas and $H_2$ can, for example, include a $H_2$/Ar mixture. Combinations of $H_2$ and an inert gas can, for example, include 90% $H_2$ or less, for example 80%, 60%, 20%, 10%, 5%, or less, and balance inert gas. An exemplary heat treatment of the bulk Cu metal fill 106a includes a gas pressure of 3 Torr and process time of 30 minutes, but embodiments of the invention are not limited by these processing conditions as other heat-treating conditions may be utilized. For example, the gas pressure can be between about 0.1 Toff and about 760 Torr. In some embodiments of the invention, the gas pressure can be between about 0.5 Toff and about 10 Torr. Exemplary heat-treating of the Ru metal film 104 in FIG. 1E and the bulk Cu metal fill 106a in FIG. 1G are described in Ser. No. 10/693,298, entitled METHOD OF FORMING LOW-RESISTIVITY COPPER FILM STRUCTURE, the entire content of which is incorporated herein by reference.

Figure 3:
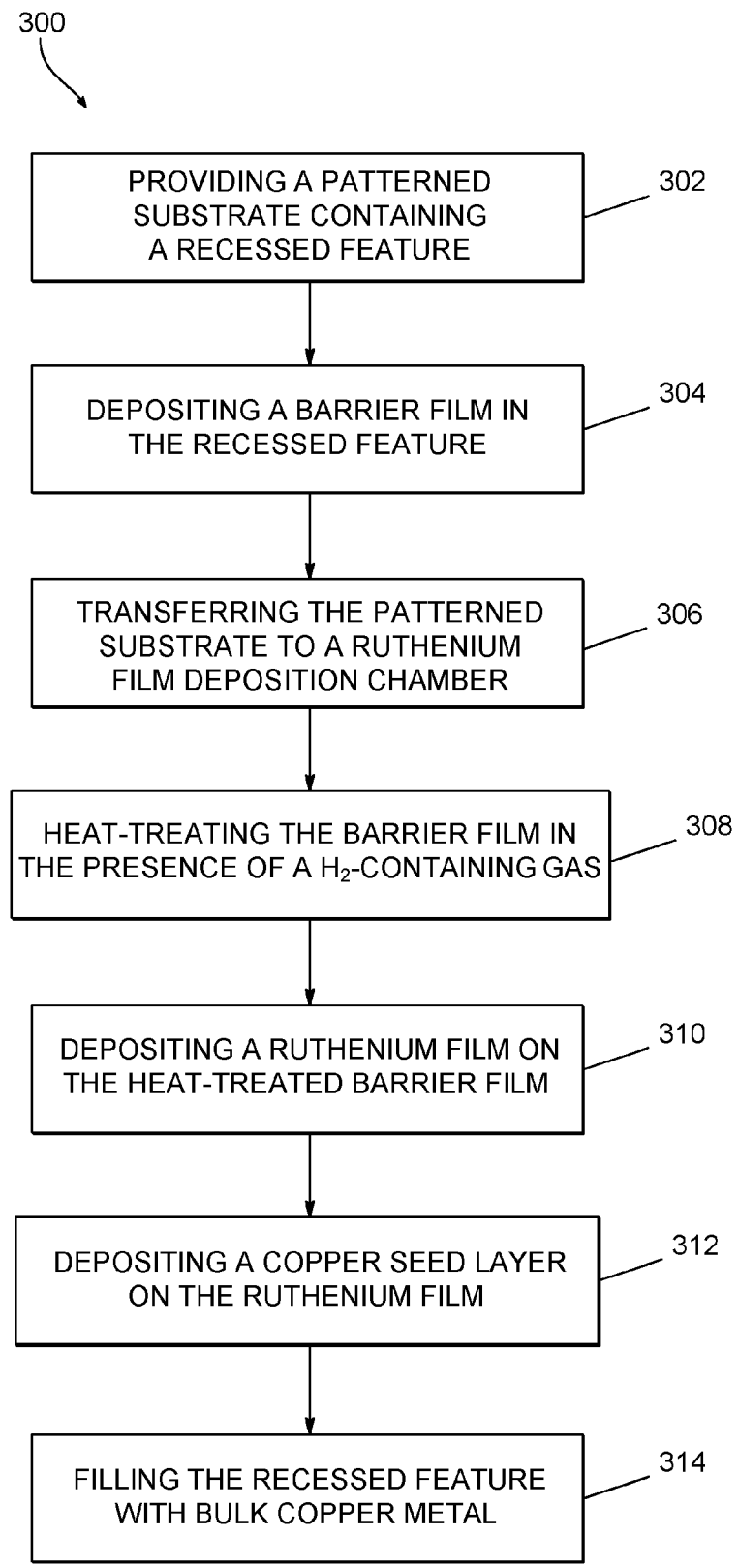
FIG. 3 is a process flow diagram for bulk Cu metal filling of a recessed feature according to an embodiment of the invention.

FIG. 3 is a process flow diagram for bulk Cu metal filling of a recessed feature according to an embodiment of the invention. The steps of the process flow diagram in FIG. 3 have been described above. It should be noted that in this application, the term "step" does not prohibit two steps from being performed simultaneously or partially overlapping in time. In FIG. 3, the process 300 includes: in step 302, providing a patterned substrate containing a recessed feature. The recessed feature can, for example, contain a via, a trench, or a combination thereof, and can be formed in a Si substrate or in a dielectric film. In step 304, a barrier film is deposited in the recessed feature in a barrier film deposition chamber. The barrier film can, for example, contain TaN, TaC, TaCN, TiN, TiC, TiCN, WN, WC, or WCN, or a combination thereof.

The process 300 further includes, in step 306, transferring the patterned substrate from the barrier film deposition chamber to a Ru metal deposition chamber; and in step 308, heat-treating the barrier film in the presence of a $H_2$-containing gas in the Ru metal deposition chamber prior to Ru metal film deposition. The heat-treating in step 306 can include exposing the barrier film to $H_2$ gas or a combination of $H_2$ gas and an inert gas. The heat-treating of the barrier film can be performed during, following, or both during and following a temperature ramp up, prior to deposition of a Ru metal film on the patterned substrate in the Ru metal deposition chamber. The process 300 further includes: in step 308, depositing a Ru metal film on the heat-treated barrier film. According to one embodiment, the Ru metal film can be deposited by exposing the patterned substrate to a process gas containing $Ru_3(CO)_{12}$ and CO.

In step 310, a Cu seed layer is deposited on the Ru metal film. According to one embodiment, the Cu seed layer can be discontinuous and cover only a portion of the Ru metal film in the recessed feature. In step 312, the recessed feature is filled with bulk Cu metal. According to one embodiment, prior to depositing the Cu seed layer in step 310, the Ru metal film may be heat-treated at a temperature between about 100° C. and about 400° C. in the presence of $H_2$ gas or a combination of an inert gas and $H_2$ gas. According to another embodiment, the Ru metal film and the Cu seed layer may be heat-treated under high-vacuum conditions or in the presence of an inert gas but not $H_2$ gas, prior to filling the recessed feature with bulk Cu metal in step 314.

Figure 4A:
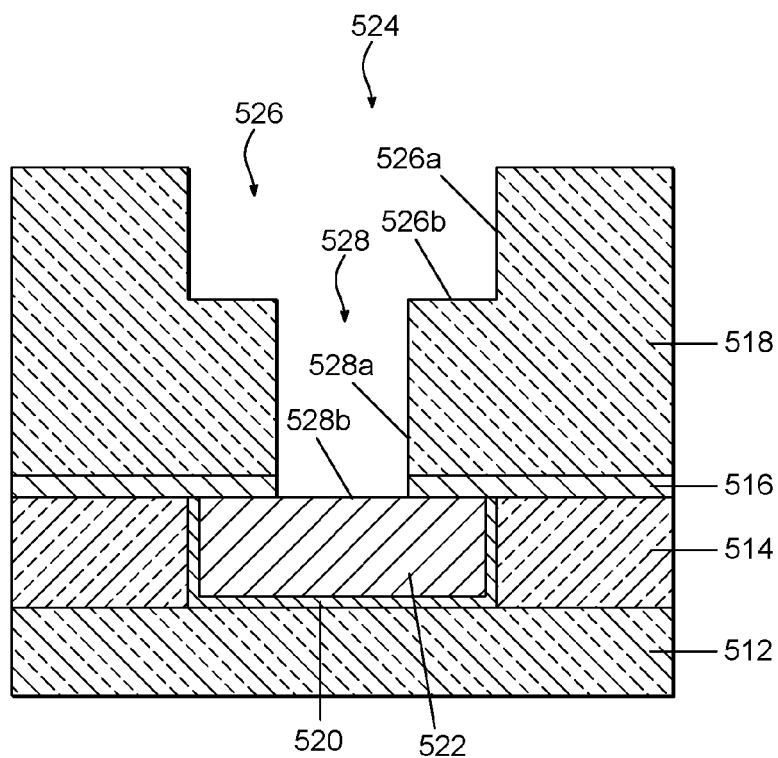
FIGS. 4A and 4B schematically show cross-sectional views of additional recessed features according to embodiments of the invention.
Figure 4B:
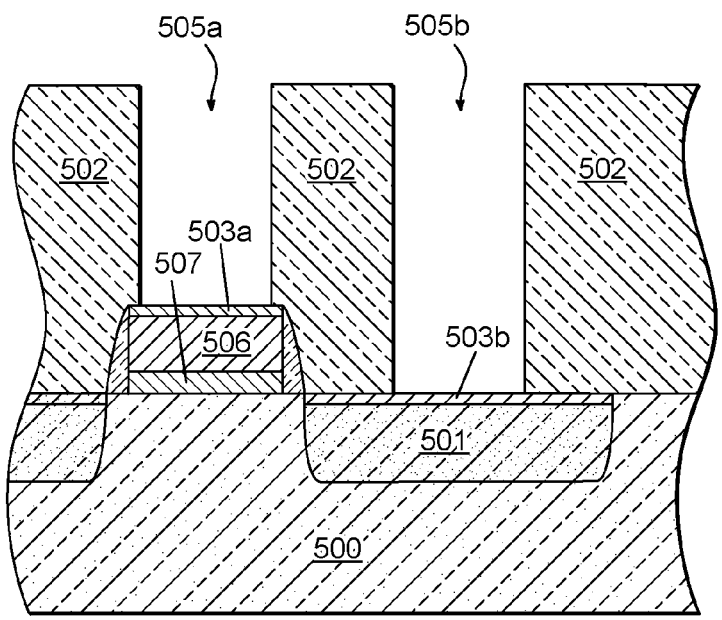

An exemplary recessed feature 1 was illustrated and described above in FIG. 1A, but embodiments of the invention may be applied to other types of recessed features found in integrated circuit design. FIGS. 4A-4B schematically show cross-sectional views of other recessed features according to additional embodiments of the invention. As will be appreciated by one of ordinary skill in the art, embodiments of the invention can be readily applied to the recessed features depicted in FIGS. 4A and 4B.

FIG. 4A schematically shows a cross-sectional view of a dual damascene interconnect structure. Dual damascene interconnect structures are well known by one of ordinary skill in the art of integrated circuit fabrication. The dual damascene interconnect structure depicted in FIG. 4A contains a dual damascene interconnect recessed feature 524 formed over a conductive interconnect structure 522. The dual damascene interconnect recessed feature 524 contains a via 528 having sidewall and bottom surfaces 528a and 528b, respectively, and a trench 526 formed in dielectric film 518, where the trench 526 contains sidewall and bottom surfaces 526a and 526b, respectively. The trench 526 may be used for an upper conductive interconnect structure and the via 528 connects the trench 526 to the conductive interconnect structure 522. The interconnect structure further contains dielectric layers 512 and 514, barrier film 520 surrounding the conductive interconnect structure 522, and etch stop layer 516. According to one embodiment, following deposition of a barrier film in the dual damascene interconnect recessed feature 524, at least a portion of the barrier film may be removed by plasma etching from the bottom surface 528b prior to depositing a Ru metal film in the dual damascene interconnect recessed feature 524. The plasma etching provides for directly contacting the Ru metal film to the conductive interconnect structure 522. According to another embodiment, at least a portion of the barrier film and the Ru metal film may be removed by plasma etching from the bottom surface 528b, thereby providing for directly contacting a bulk Cu metal fill in the dual damascene interconnect recessed feature 524 to the conductive interconnect structure 522.

FIG. 4B schematically shows a cross-sectional view of a patterned structure according to another embodiment of the invention. The patterned structure contains a recessed feature 505a formed in a dielectric film 502 and a conductive layer 503a formed on a gate electrode 506 at the bottom of the recessed feature 505a. The gate electrode 506 is part of a gate structure that further contains a gate dielectric film 507. The gate dielectric film 507 can contain $SiO_2$, $SiO_xN_y$, $SiN_y$, or a high dielectric constant (high-k) material having a dielectric constant greater than that of $SiO_2$ (k~3.9), or a combination thereof. High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or $BaO$, or combinations of two or more thereof.

Furthermore, the patterned structure in FIG. 4B contains a recessed feature 505b formed in the dielectric film 502 and a conductive layer 503b formed on a doped substrate region 501 (e.g., a drain or a source region) in the substrate 500 at the bottom of the recessed feature 505b. The substrate 500 can, for example, be a 200 mm Si wafer, a 300 mm Si wafer, or an even larger Si wafer. The dielectric film 502 can contain $SiO_2$, SiON, SiN, or a low dielectric constant (low-k) material having a dielectric constant less than that of $SiO_2$ (K~3.9). Common low-k materials can contain simple or complex compounds of Si, O, N, C, H, and/or halogens, either as dense or porous materials. According to an embodiment of the invention, the recessed features 505a, 505b can be vias with aspect ratios (depth/width) greater than or equal to about 2, for example 3, 4, 5, 6, 7, 12, 15, or higher. The vias can have widths of about 200 nm or less, for example 150 nm, 100 nm, 65 nm, 45 nm, 32 nm, 20 nm, or lower. In one example, the recessed features 505a, 505b can be 45 nm wide vias with aspect ratios of about 7. However, embodiments of the invention are not limited to these aspect ratios or via widths, as other aspect ratios or via widths may be utilized. The conductive layers 503a and 503b can include silicide contact layers that provide thin stable electrical contacts and can, for example, contain $CoSi_2$, PtSi, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. Processing methods for forming the patterned structures depicted in FIGS. 4A and 4B are well known to one skilled in the art.

A plurality of embodiments for forming low-resistivity recessed features for Cu metallization of semiconductor devices has been disclosed in various embodiments. The recessed features can include vias and trenches traditionally found in integrated circuits. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the patterned substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor device, the method comprising:
    providing a patterned substrate containing a recessed feature;
    depositing a barrier film in the recessed feature in a barrier film deposition chamber;
    transferring the patterned substrate from the barrier film deposition chamber to a Ru metal deposition chamber;
    heat-treating the barrier film in the presence of a $H_2$-containing gas in the Ru metal deposition chamber;
    depositing a Ru metal film on the heat-treated barrier film;
    depositing a discontinuous Cu seed layer on the Ru metal film so as to cover a portion of the Ru metal film in the recessed feature; and
    filling the recessed feature with bulk Cu metal.

2. The method of claim 1, wherein heat-treating the barrier film comprises: exposing the barrier film to $H_2$ gas or a combination of an inert gas and $H_2$ gas.

3. The method of claim 2, wherein the heat-treating further comprises: during the exposing, ramping up the temperature of the patterned substrate from a first temperature to a second temperature suitable for Ru metal deposition, wherein the second temperature is between about 150° C. and about 400° C.

4. The method of claim 1, wherein depositing the Ru metal film comprises: exposing the patterned substrate to a process gas containing $Ru_3(CO)_{12}$ and CO.

5. The method of claim 1, further comprising:
    prior to the filling, heat-treating the Cu seed layer and the Ru metal film under high vacuum conditions or in the presence of an inert gas but not $H_2$ gas to activate the Ru metal film for Cu plating, wherein the heat-treating further includes maintaining the patterned substrate at temperature between about 100° C. and about 400° C.

6. The method of claim 1, wherein the Cu seed layer is sputter deposited from a solid Cu target.

7. The method of claim 1, further comprising:
    prior to depositing the Cu seed layer, heat-treating the Ru metal film at a temperature between about 100° C. and about 400° C. in the presence of $H_2$ gas or a combination of an inert gas and $H_2$ gas.

8. The method of claim 1, further comprising:
    planarizing the bulk Cu metal; and
    heat-treating the planarized bulk Cu metal at a temperature between about 100° C. and about 400° C. in the presence of $H_2$ gas or a combination of an inert gas and $H_2$ gas.

9. The method of claim 1, further comprising:
    at least partially removing the barrier film from a bottom surface of the recessed feature prior to depositing the Ru metal film.

10. The method of claim 1, further comprising:
    at least partially removing the barrier film and the Ru metal film from a bottom surface of the recessed feature prior to depositing the Cu seed layer.

11. A method for forming a semiconductor device, the method comprising:
    providing a patterned substrate containing a recessed feature formed in a dielectric film, the recessed feature containing a via, a trench, or a combination thereof;
    depositing a TaN or TaCN barrier film in the recessed feature in a barrier film deposition chamber;
    transferring the patterned substrate from the barrier film deposition chamber to a Ru metal deposition chamber;
    heat-treating the barrier film in the presence of a $H_2$-containing gas in the Ru metal deposition chamber;
    depositing a Ru metal film on the heat-treated barrier film by exposing the patterned substrate to a process gas containing $Ru_3(CO)_{12}$ and CO;
    depositing a discontinuous Cu seed layer on the Ru metal film by sputter deposition, the Cu seed layer partially covering the Ru metal film on a side wall in the recessed feature;
    filling the recessed feature with bulk Cu metal in an electrochemical plating process or an electroless plating process; and
    planarizing the bulk Cu metal fill.

12. The method of claim 11, wherein heat-treating the barrier film comprises:
    exposing the barrier film to $H_2$ gas or a combination of an inert gas and $H_2$ gas.

13. The method of claim 12, wherein the heat-treating further comprises:
    during the exposing, ramping up the temperature of the patterned substrate from a first temperature to a second temperature suitable for Ru metal deposition, wherein the second temperature is between about 150° C. and about 400° C.

14. The method of claim 11, further comprising:
    heat-treating the discontinuous Cu seed layer and the Ru metal film under high vacuum conditions or in the presence of an inert gas but not $H_2$ gas.

15. The method of claim 11, wherein the patterned substrate contains a first recessed feature formed in the dielectric film and a first conductive layer formed on a gate electrode at the bottom of the first recessed feature, the patterned substrate further containing a second recessed feature formed in the dielectric film and a second conductive layer formed on a doped substrate region in the patterned substrate at the bottom of the second recessed feature, and wherein the steps of the method are performed in each of the first and second recessed features.

16. The method of claim 11, further comprising:
    heat-treating the planarized bulk Cu metal fill at a temperature between about 100° C. and about 400° C. in the presence of $H_2$ gas or a combination of an inert gas and $H_2$ gas.

17. A method for forming a semiconductor device, the method comprising:
    providing a patterned substrate containing a recessed feature;
    depositing a barrier film in the recessed feature in a barrier film deposition chamber;

transferring the patterned substrate from the barrier film, deposition chamber to a Ru metal deposition chamber;

heat-treating the barrier film in the presence of a $H_2$-containing gas in the Ru metal deposition chamber by exposing the barrier film to $H_2$ gas or a combination of an inert gas and $H_2$ gas while ramping up the temperature of the patterned substrate from a first temperature to a second temperature suitable for Ru metal deposition, wherein the second temperature is between about 150° C. and about 400° C.;

depositing a Ru metal film on the heat-treated barrier film;

heat-treating the Ru metal film at a temperature between about 100° C. and about 400° C. in the presence of $H_2$ gas or a combination of an inert gas and $H_2$ gas;

depositing a Cu seed layer on the Ru metal film; and filling the recessed feature with bulk Cu metal.

18. The method of claim 17, wherein depositing the Cu seed layer comprises:

depositing a discontinuous Cu seed layer on the Ru metal fin, the Cu seed layer covering a portion of the Ru metal film in the recessed feature.

19. The method of claim 18, further comprising:

heat-treating the discontinuous Cu seed layer and the Ru metal film under high vacuum conditions or in the presence of an inert gas but not $H_2$ gas.

20. The method of claim 17, further comprising:

planarizing the bulk Cu metal; and heat-treating the planarized bulk Cu metal at a temperature between about 100° C. and about 400° C. in the presence of $H_2$ gas or a combination of an inert gas and $H_2$ gas.

* * * * *

UNITED STATES PATENT AND TRADEMARK OFFICE
CERTIFICATE OF CORRECTION

| | |
|---|---|
| PATENT NO. | : 7,704,879 B2 |
| APPLICATION NO. | : 11/864960 |
| DATED | : April 27, 2010 |
| INVENTOR(S) | : Kenji Suzuki |

It is certified that error appears in the above-identified patent and that said Letters Patent is hereby corrected as shown below:

Cover Page, Col. 1, "(22) Filed: Nov. 20, 2007" should read --(22) Filed: Sept. 27, 2007--.

Col. 2, lines 56-57, "includes, depositing" should read --includes depositing--.

Col. 3, line 30, "roughness increased" should read --roughness and increased--.

Col. 3, line 61, "not necessary" should read --not necessarily--.

Col. 3, line 66, "but do not denote" should read --but does not denote--.

Col. 8, line 49, "substrate 100 in FIG. 1G may be" should read --substrate 100 may be--.

Col. 8, line 52, "bulk Cu metal fill 106a." should read --bulk Cu metal fill.--.

Col. 8, line 53, "bulk Cu metal fill 106a may be" should read --bulk Cu metal fill may be--.

Col. 8, lines 60-61, ""metal fill 106a includes" should read --metal fill includes--.

Col. 8, line 65, "0.1 Toff" should read --0.1 Torr--.

Col. 8, line 66, "about 0.5 Toff" should read --about 0.5 Torr--.

Col. 9, line 1, "metal fill 106a in FIG. 1G are" should read --metal fill are--.

Col. 9, line 2, "Ser. No. 10/693,298" should read --Ser. No. 11/693,298--.

Col. 11, line 49, Claim 5, "further comprising;" should read --further comprising:--.

Col. 13, lines 1-2, Claim 17, "barrier film, deposition" should read --barrier film deposition--.

Col. 14, line 4, "fin, the Cu" should read --film, the Cu--.

Signed and Sealed this

Seventh Day of September, 2010

David J. Kappos
*Director of the United States Patent and Trademark Office*